United States Patent [19]

Fukushima

[11] Patent Number: 4,903,028
[45] Date of Patent: Feb. 20, 1990

[54] ANALOG-TO-DIGITAL CONVERTER

[75] Inventor: Noriyuki Fukushima, Kanagawa, Japan

[73] Assignee: Sony Corporation, Tokyo, Japan

[21] Appl. No.: 299,016

[22] Filed: Jan. 19, 1989

[30] Foreign Application Priority Data

Jan. 27, 1988 [JP] Japan .................................. 63-16269

[51] Int. Cl.$^4$ ............................................. H03M 1/00
[52] U.S. Cl. ..................................... 341/156; 307/361
[58] Field of Search ................................ 341/156, 155

[56] References Cited

U.S. PATENT DOCUMENTS

| | | | |
|---|---|---|---|
| 4,214,233 | 7/1980 | Shaw et al. | 341/156 |
| 4,218,675 | 8/1980 | Shaw et al. | 341/156 |
| 4,533,903 | 8/1985 | Yamada et al. | 340/347 AD |
| 4,568,910 | 2/1986 | Sekino et al. | 341/156 |
| 4,599,599 | 7/1986 | Sekino et al. | 341/156 |

FOREIGN PATENT DOCUMENTS 0070734 1/1983 European Pat. Off. .
0144127 7/1986 Japan .

*Primary Examiner*—William M. Shoop, Jr.
*Assistant Examiner*—Helen Kim
*Attorney, Agent, or Firm*—Ronald P. Kananen

[57] ABSTRACT

An analog-to-digital converter for converting an analog input voltage signal to a digital output voltage signal of m upper bits and n lower bits which has a plurality of resistors connected in a series circuit to a voltage source for establishing respective reference voltages, an upper bit encoder having a first input receiving the analog input voltage and second inputs connected to the series circuit at respective intervals defining groups of the resistor therebetween for generating the m upper bits and a switch control signal, each of the groups including a plurality of the resistors, a first lower bit encoder having a first input receiving the analog input voltage signal and second inputs for generating the n lower bits, a second lower bit encoder having a first input receiving the analog input voltage signal and second inputs for generating the n lower bits, a switch circuit associated with each of the groups of the resistors and responsive to the switch control signal for selectively connecting each of the second inputs of the first and second lower bit encoders to respective resistors in the associated group of the resistors, and a circuit for alernately combining the m upper bits with the n lower bits generated by the first and second lower bit encoders and for generating the digital output voltage signal.

8 Claims, 6 Drawing Sheets

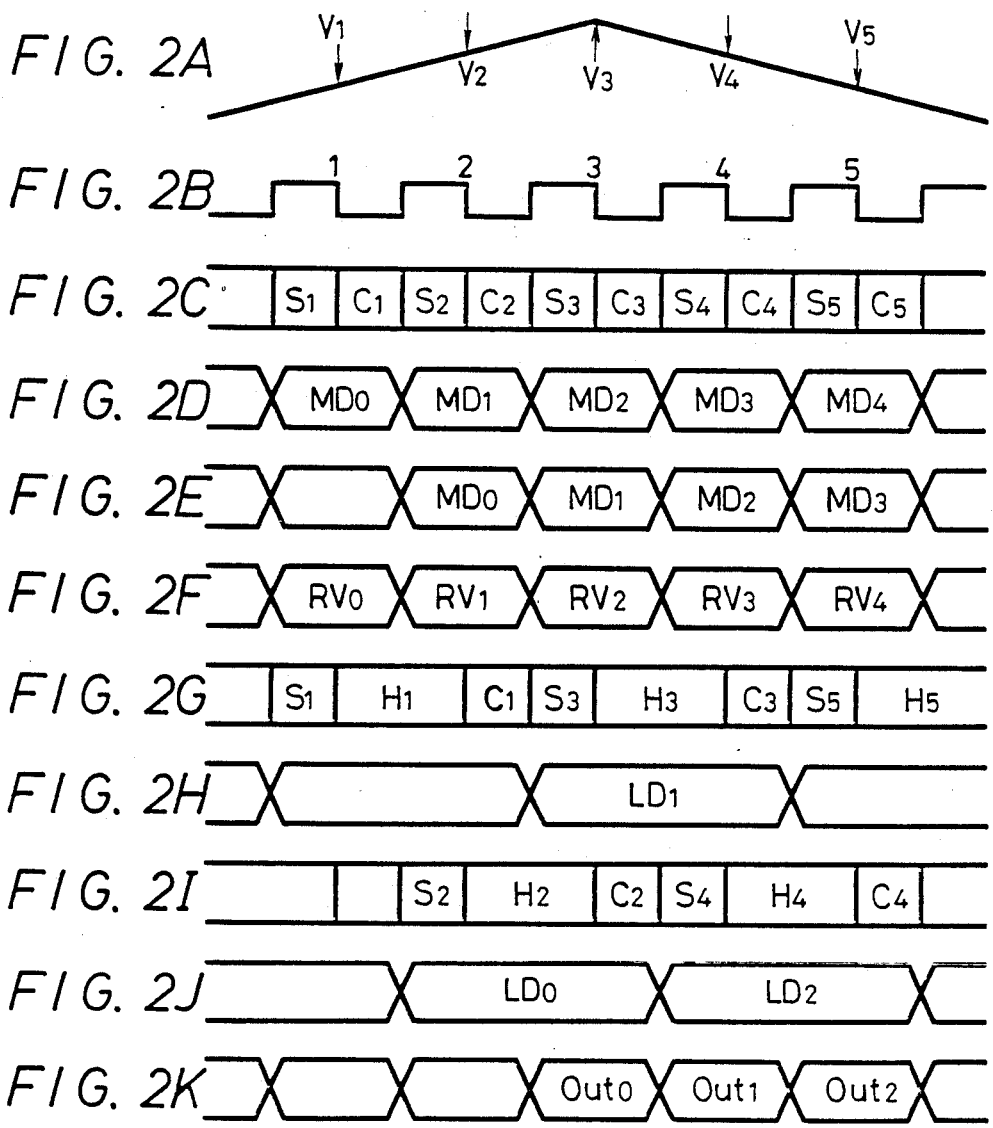

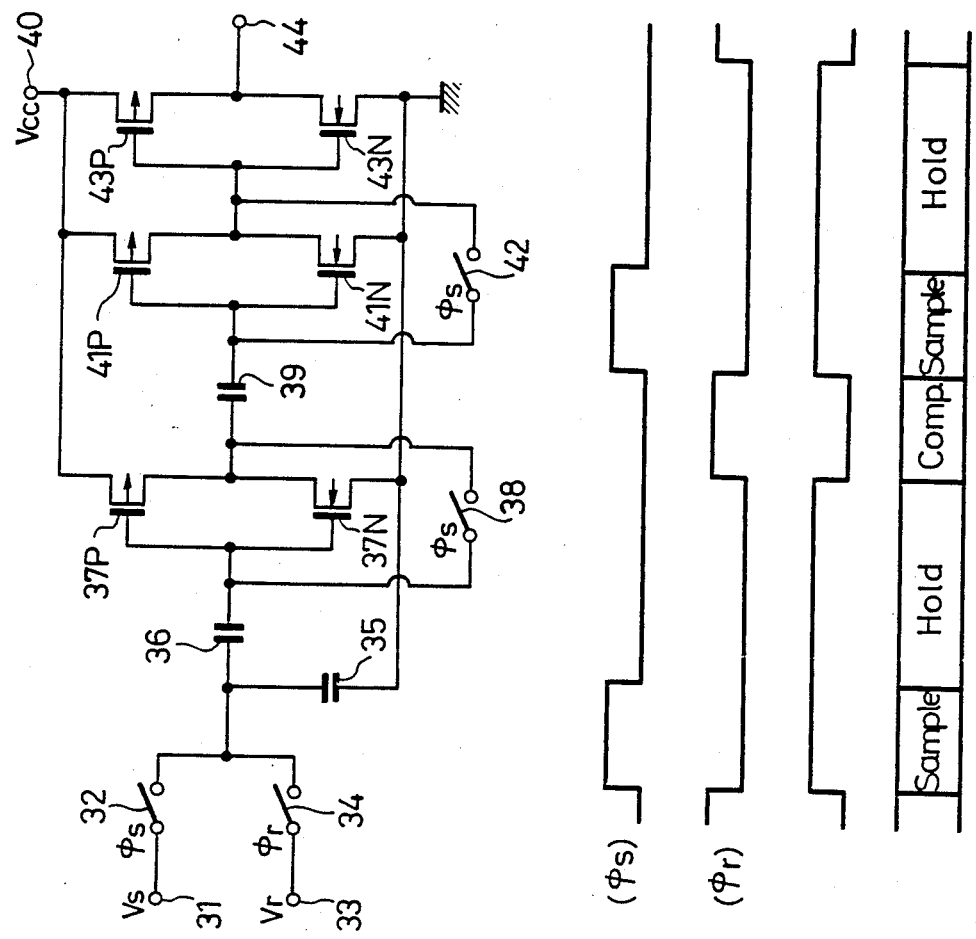

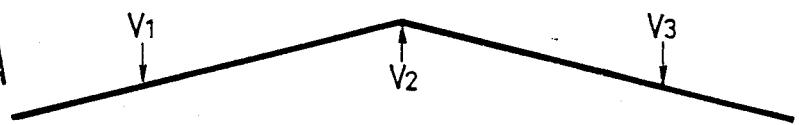
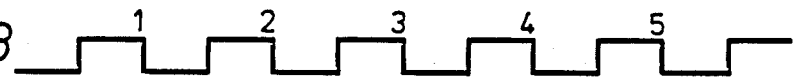
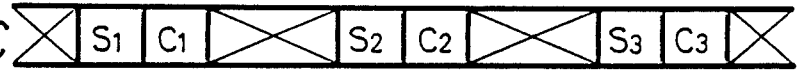
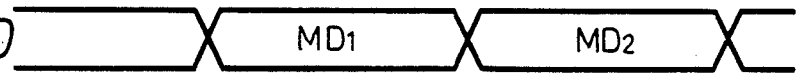
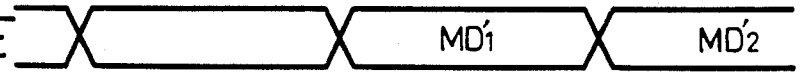
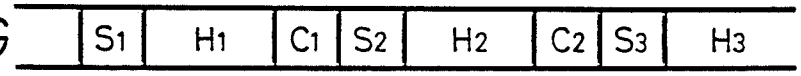
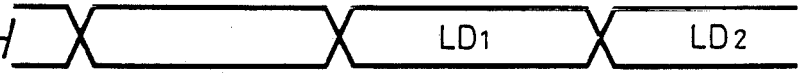
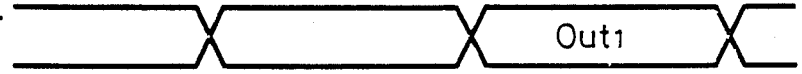

ANALOG-TO-DIGITAL CONVERTER

BACKGROUND OF THE INVENTION

1. Field of the Invention

The present invention relates generally to an analog-to-digital (A/D) converter, and more particularly to such an A/D converter referred to as deserializer system which divides data to be converted into upper data and lower data for carrying out A/D conversion.

2. Description of the Prior Art

There is generally known, as a high speed A/D converter, a parallel type (flash system) A/D converter which is provided with a comparator for each of all levels to be converted to process all the levels in parallel. However, the parallel type A/D converter requires not less than 255 comparators for A/D conversion of, for example, eight bits, and the resulting circuit configuration is extremely large.

On the other hand, U.S. Pat. No. 4,533,903, assigned to the same assignee of the present invention, proposes an A/D converter referred to as deserializer system which divides input data into upper data and lower data. According to this deserializer system, the number of comparators required for an eight-bit A/D conversion can be largely reduced to 15 for the upper data and 15 for the lower data, i.e., a total of 30.

However, since the A/D converter in accordance with the deserializer system performs A/D conversion twice, i.e. first a conversion for upper data and thereafter a conversion for lower data, it requires comparisons in two stages, thereby incurring a problem that the A/D conversion speed is decreased to approximately one-half.

Also, if a perfect matching is not provided between a circuit for A/D converting the upper data and that for the lower data, there is a fear that the linearity is deteriorated in the vicinity of the boundary of the upper data.

In the above-mentioned circuit, it is necessary to provide the same input signal upon A/D converting the upper data and the lower data. For this reason, various methods have been provided, such as a method of sampling and holding an input signal before supplying the same to the comparators for conversions of the upper and lower data.

However, it is impossible to eliminate fluctuations in signal voltage in a sample and hold circuit. Therefore, if a fluctuation causes a signal level to be increased, the signal level supplied for converting the lower data is higher than that for converting the upper data, whereby if the signal is converted in the vicinity of the boundary of conversion in the process of the upper data conversion, the signal supplied for the lower data conversion, thus having a higher level than the signal supplied for the upper data conversion, will exceed the upper limit of the conversion range of the lower data. In such occasion, the lower data remains a maximal value, thereby presenting distortion due to the width of fluctuation $\Delta V$ caused by the sample and hold circuit.

OBJECTS AND SUMMARY OF THE INVENTION

It is an object of the present invention to provide a novel A/D converter which is capable of overcoming problems inherent in the prior art A/D converters.

It is another object of the present invention to provide an A/D converter of the deserializer system which can operate at a speed equivalent to that of the parallel type A/D converter.

It is a further object of the present invention to provide an A/D converter of a deserializer system which provides a favorable linearity in the vicinity of the boundary of the upper data.

According to a first aspect of the present invention there is provided an analog-to-digital converter for converting an analog input voltage signal to a digital output voltage signal of m upper bits and n lower bits, comprising:

a plurality of resistor means connected in a series circuit to a voltage source for establishing respective reference voltages;

upper bit encoder means having a first input receiving the analog input voltage and second inputs connected to the series circuit at respective intervals defining groups of the resistor means therebetween for generating the m upper bits and a switch control signal, each of the groups including a plurality of the resistor means;

first lower bit encoder means having a first input receiving the analog input voltage signal and second inputs for generating the n lower bits;

second lower bit encoder means having a first input receiving the analog input voltage signal and second inputs for generating the n lower bits;

switch means associated with each of the groups of the resistor means and responsive to the switch control signal for selectively connecting each of the second inputs of the first and second lower bit encoder means to respective resistor means in the associated group of the resistor means, and means for alternately combining the m upper bits with the n lower bits generated by the first and second lower bit encoder means, and for generating the digital output voltage signal.

According to a second aspect of the invention, there is provided an analog-to-digital converter for converting an analog input voltage signal to a digital output voltage signal of m upper bits and n lower bits, comprising:

a plurality of resistor means connected in a series circuit to a voltage source for establishing respective reference voltages;

upper bit encoder means having a first input receiving the analog input voltage and second inputs connected to the series circuit at respective intervals defining groups of the resistor means therebetween for generating the m upper bits and a switch control signal, each of the groups including a plurality of the resistor means;

lower bit encoder means having a first input receiving the analog input voltage signal, second inputs and third inputs for generating the n lower bits;

switch means associated with each of the groups of the resistor means and responsive to the switch control signal for selectively connecting each of the second inputs of the lower bit encoder means to respective resistor means in the associated group of the resistor means and for selectively connecting each of the third inputs of the lower bit encoder means to a predetermined number of the resistor means adjoining to and beside the associated group the resistor means, and means responsive to an output signal from the lower bit encoder means for adding 1 to or subtracting 1 from the m upper bits when the analog input voltage signal corresponds to the reference voltages supplied to the third inputs of the lower bit encoder means.

These and other objects, features and advantages of the present invention will become apparent from the following detailed description of the preferred embodiments taken in conjunction with the accompanying drawings, throughout which like reference numerals designate like elements and parts.

BRIEF DESCRIPTION OF THE DRAWINGS

FIGS. 2A–2K are timing charts used for explaining the operation of the A/D converter of FIG. 1;

FIG. 3 is a schematic circuit diagram showing an embodiment of a comparator having a holding function according to present invention;

FIGS. 4A–4D are timing charts used for explaining the operation of the comparator shown in FIG. 3;

FIGS. 7A–7I are timing charts used for explaining the operation of the second embodiment of the A/D converter shown in FIG. 5.

DETAILED DESCRIPTION OF THE PREFERRED EMBODIMENTS

A first embodiment of an A/D converter according to the present invention will hereinafter be described with reference to FIG. 1.

Figure 1:
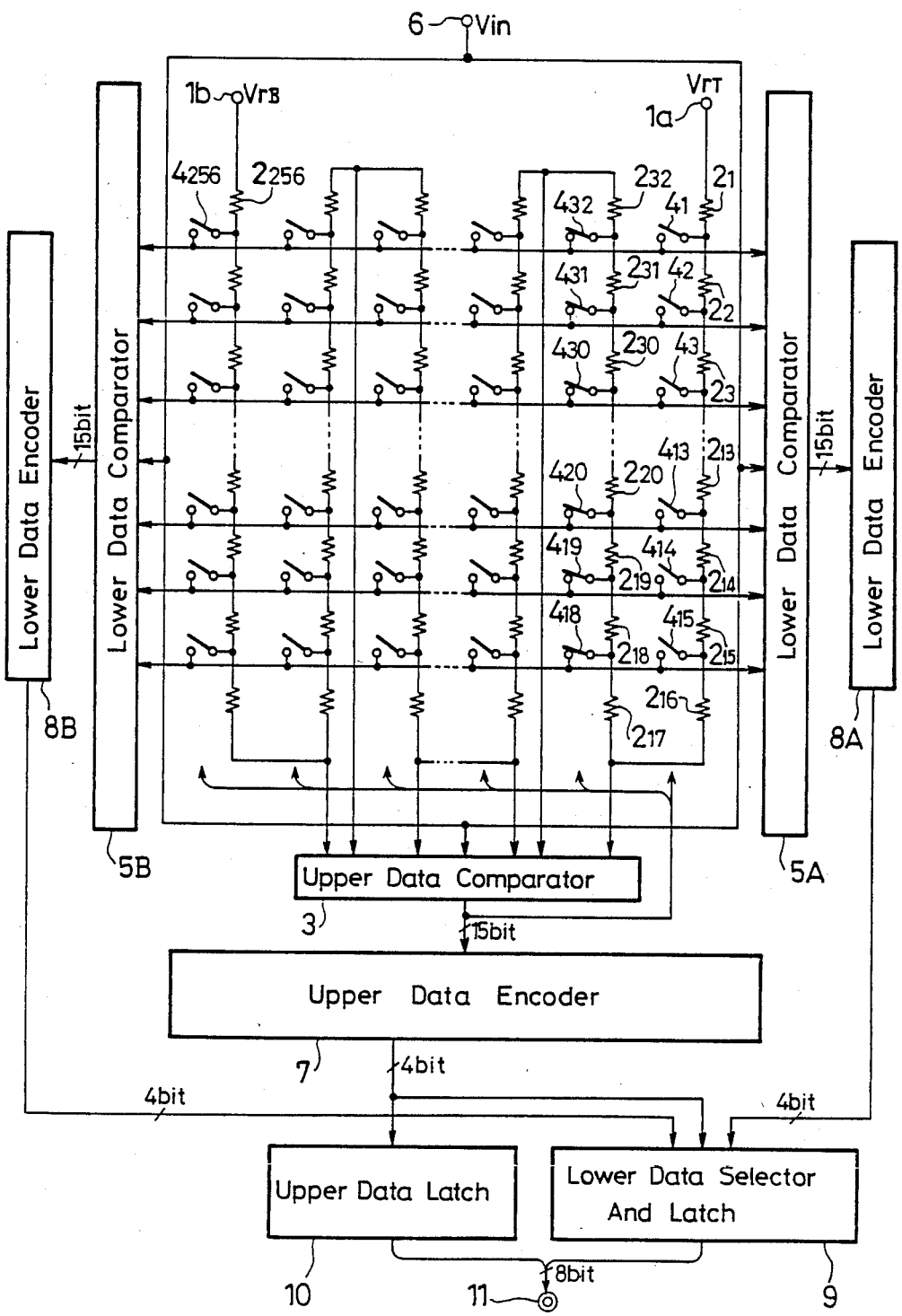
FIG. 1 is a block diagram illustrating a first embodiment of an A/D converter according to the present invention.

In FIG. 1, terminals $1a$ and $1b$ are respectively supplied with a maximal voltage $V_{rT}$ and a minimal voltage $V_{rB}$ used for A/D conversion. Between the terminals $1a$ and $1b$, a series circuit of 256 resistors $2_1$–$2_{256}$ having the same resistance value upon, for example, 8-bit A/D conversion is provided in such a manner that resistor strings respectively formed of sixteen resistors are disposed in a zig-zag pattern, as shown in FIG. 1. The series circuit of the resistors $2_1$–$2_{256}$ is divided into sixteen resistor groups respectively formed of sixteen laterally disposed resistors, and the connecting points (fifteen points) of the respective resistor groups are connected to an upper data comparator 3.

The resistors $2_1$–$2_{256}$ belonging to the same stage in the lateral direction have their one ends connected with each other through switches $4_1$–$4_{256}$. The respective connecting points (sixteen points) are coupled in parallel to a pair of lower data comparators 5A and 5B. However, the switch 4 is not provided to resistors $2_{16}$, $2_{17}$, . . . , $2_{240}$, $2_{241}$ in the lowest stage.

An input terminal 6 to which an input signal voltage Vin is supplied is coupled to the comparators 3, 5A and 5B.

First, in the comparator 3 the voltages of the respective connecting points of every sixteen of the resistors $2_1$–$2_{256}$ are compared with the input signal voltage Vin and fifteen of the resulting comparison outputs are derived therefrom. The comparison outputs are derived in a manner that only one output corresponding to the input signal voltage Vin is at a high level and the other outputs are all at a low level.

These comparison outputs are supplied to an upper data encoder 7 for generating, for example, a four-bit digital code. Also, one of the columns in the vertical direction formed of the switches $4_1$–$4_{256}$ is selected in response to the comparison outputs, and the switches in the selected column are all turned on. Incidentally, FIG. 1 illustrates a case where the comparison output is derived to the second column from the maximal voltage $V_{rT}$ and the switches $4_{17}$–$4_{32}$ in the second column from the right of the drawing are turned on.

Therefore, the comparators 5A and 5B are supplied with the voltages at the fifteen connecting points of the serially connected resistors $2_{17}$–$2_{32}$, whereby these voltages are compared with the input signal voltage Vin by the comparators 5A and 5B and fifteen comparison outputs are derived therefrom.

These comparison outputs are supplied to lower data encoders 8A and 8B for generating, for example, a four-bit digital code. The encoded values by the encoders 8A and 8B are alternately selected and latched by a lower data selector/latch circuit 9.

The lower data selector/latch circuit 9 is also supplied with the least significant bit of the four-bit data from the upper data encoder 7 which is used to detect whether the selected sixteen resistors are in an even-numbered column or an odd-numbered column. The four-bit lower data from the lower data encoders 8A and 8B is inverted or not on the basis of the detection result. For example, assuming that the resistors $2_1$–$2_{16}$ in the rightmost column are selected and the detection result obtained by the lower data comparator 5A shows that the input signal voltage Vin corresponds to the voltage across the resistor $2_2$, the four-bit output from the lower data encoders 8A and 8B shows (1110) which is latched by the lower data selector/latch circuit 9 without inversion. This is because the voltage across the resistor $2_2$ is the second highest of the voltages across the resistors $2_1$–$2_{16}$. Alternatively, if the resistors $2_{17}$–$2_{32}$ in the second column from the right are selected and if it is detected by the lower data comparator 5A that the input signal voltage Vin corresponds to the voltage across the resistor $2_{31}$, the four-bit output from the lower data encoders 8A and 8B shows (1110), equal to the above-mentioned case where the input signal voltage Vin corresponds to the voltage across the resistor $2_2$. This is because the resistors $2_2$ and $2_{31}$ both belong to the second stage from the uppermost stage so that the voltages across the resistors $2_2$ and $2_{31}$ are inputted to the lower data comparator 5A through the same line.

On the other hand, the output (1110) from the lower data encoder 8A is inverted by the lower data selector/latch circuit 9 to (0001) which in turn is combined with the four-bit output from the upper data latch circuit 10 and outputted from an output terminal 11 as eight-bit data. The four-bit data from the lower data encoder 8A is inverted because the voltage across the resistor $2_{31}$ is the second lowest of the voltages across the resistors $2_{17}$–$2_{232}$. Thus, even if the fifteen outputs from the respective lower data comparators 5A and 5B, i.e., the comparison results, are the same, the four-bit outputs from the lower data encoders 8A and 8B are inverted or not by the lower data selector/latch circuit 9 depending on the resistors in a selected column whether they belong to an odd-numbered column or an even-numbered column, whereby correct lower data can be derived.

The above described circuit thus permits the A/D conversion at a speed equal to that of the parallel system by alternately converting lower data and converting the upper data at a double speed.

FIGS. 2A–2K are timing charts of the operation of the A/D converter as described above.

FIG. 2A shows the waveform of an analog input signal Vin and FIG. 2B that of a clock signal. The comparator 3 samples a signal voltage $V_1$ ($S_1$) in the high level period of a cycle 1 of the clock signal and compares the same ($C_1$) in the low level period of the cycle 1 of the clock signal as shown in FIG. 2C. By this operation, upper data $MD_1$ is formed in the high level period of a cycle 2 of the clock signal as shown in FIG. 2D.

Further, switches in one of the columns of the switches $4_1$–$4_{256}$ are selected in accordance with the output from the comparator 3, and fifteen reference voltages RV, as shown in FIG. 2F are supplied to the comparators 5A and 5B through the switches belonging to the selected column.

In the comparator 5A, the signal voltage $V_1$ sampled ($S_1$) in the high level period of the cycle 1 of the clock signal is held ($H_1$) in the low level period 1 and the high level period of the cycle 2 of the clock signal and compared ($C_1$) in the low level period of the cycle 2 as shown in FIG. 2G, whereby lower data $LD_1$ is formed in the high level period of the cycle 3 as shown in FIG. 2H and the upper data $MD_1$ is latched as shown in FIG. 2E. Then, the latched data $MD_1$ and the lower data $LD_1$ are outputted ($Out_1$) in a cycle 4 of the clock signal as shown in FIG. 2K.

In the comparator 5B, on the other hand, as shown in FIG. 2I, a signal voltage $V_2$ sampled ($S_2$) in the high level period of the cycle 2 of the clock signal is held in the low level period and the high level period of the cycle 3 of the clock signal and compared ($C_2$) in the low level period of the cycle 3, whereby lower data $LD_2$ is formed in the high level period of the cycle 4 as shown in FIG. 2J and the upper data $MD_2$ is latched as shown in FIG. 2E. Then, the latched data $MD_2$ and the lower data $LD_2$ are outputted ($Out_2$) in a cycle 5 of the clock signal as shown in FIG. 2K.

The same operation is repeated thereafter.

By the above-mentioned operation, a digital output can be derived at every cycle of the clock signal, and accordingly the A/D conversion can be performed at a speed equal to that of the parallel system A/D converter.

It should be noted that the increased number of comparators in the present embodiment is only fifteen, in the case of eight bits, in addition to thirty which are required for an ordinary deserializer type A/D converter. Therefore, the total number of the increased comparators is no more than 45.

It is necessary in the above-mentioned circuit that the comparators 5A and 5B hold a signal voltage independently of each other. For this purpose, each of the comparators 5A and 5B employs fifteen comparators having a hold function as will be described below.

In FIG. 3, a terminal 31, which is supplied with a signal voltage Vs, is connected to one end of a switch 32. A terminal 33, which is supplied with a reference signal voltage Vr, is connected to one end of a switch 34. The other terminals of the switches 32 and 34 are connected with each other. The connecting point of the switches 32 and 34 is grounded through a capacitor 35 as well as connected to one terminal of a capacitor 36. The other terminal of the capacitor 36 is connected to the gates of a P-type MOS transistor 37P and an N-type MOS transistor 37N constituting an inverter amplifier. The source of the transistor 37P is connected to a power supply terminal 40. The source of the transistor 37N is grounded. The drains of the transistors 37P and 37N are connected with each other, and an inverter output is taken out from this connecting point. The connecting point of the drains of the transistors 37P and 37N is connected to the other terminal of the capacitor 36 through a switch 38.

Further, the connecting point of the drains of the transistors 37P and 37N is connected to one terminal of a capacitor 39, the other terminal of which is connected to the gates of a P-type MOS transistor 41P and an N-type MOS transistor 41N connected in the same manner as the transistors 37P and 37N to constitute an inverter amplifier. The drains of the transistors 41P and 41N are connected with each other, and this connecting point is connected to the gates of the transistors 41P and 41N through switch 42. An output terminal 44 is led out from the connecting point of the drains of the transistors 41P and 41N through a P-type MOS transistor 43P and an N-type MOS transistor 43N constituting an inverter amplifier.

In the above-mentioned circuit, the switch 32 is ON-/OFF controlled in the phase of a clock signal $\phi s$ as shown in FIG. 4A such that it is turned on, for example, corresponding to the high level period of the clock signal $\phi s$. The switches 38 and 42 are also ON/OFF controlled in the same phase as the switch 32, while the switch 34 is ON/OFF controlled in the phase of a clock signal $\phi r$ as shown in FIG. 4B such that it is turned on, for example, corresponding to the high level period of the clock signal $\phi r$.

When the switches 32, 38 and 42 are turned on corresponding to the high level period of the signal $\phi s$, an input signal voltage Vs is supplied to the circuit, and subsequently the capacitors 36 and 39 are charged so as to be stabilized with this voltage. When the signals $\phi s$ and $\phi r$ both go low in level, the switches 32, 34, 38 and 42 are all turned off. At this time, since the input/output impedance values of the inverter amplifiers 37 and 41 are high, the voltages charged in the capacitors 36 and 39 are held. When the signal $\phi r$ goes high in level, the switch 34 is turned on, wherein the held signal voltage Vs is compared with the reference voltage Vr supplied through the switch 34 from one end of each resistor, and the comparison result is taken out as an output signal in an output period as shown in FIG. 4C.

Therefore, the circuit operates as shown in FIG. 4D, wherein the signal voltage Vs supplied in the high level period of the signal $\phi s$ is sampled and held in the low level period of the signal $\phi r$ and compared with the reference voltage Vr in the high level period of the signal $\phi r$.

The capacitance value of the capacitor 35 is selected to be close to that of the capacitor 36 so that the signal voltage Vs is stabilized, and consequently a favorable output signal can be derived.

As described above, since the switches 38 and 42 are turned on and off in the same phase as the switch 32, the input signal voltage Vs is held and compared with the reference voltage Vr, thereby making it possible to provide a comparator with a hold function in a simple construction. Also, the provision of the capacitor 35 permits a stable output signal to be derived.

According to the first embodiment of the present invention, the upper data can be converted at a double speed by alternately converting the lower data, with the result that the A/D conversion can be performed at a speed equal to the parallel system A/D converter.

Next, a second embodiment of the present invention will hereinafter be described with reference to FIG. 5.

Figure 5:
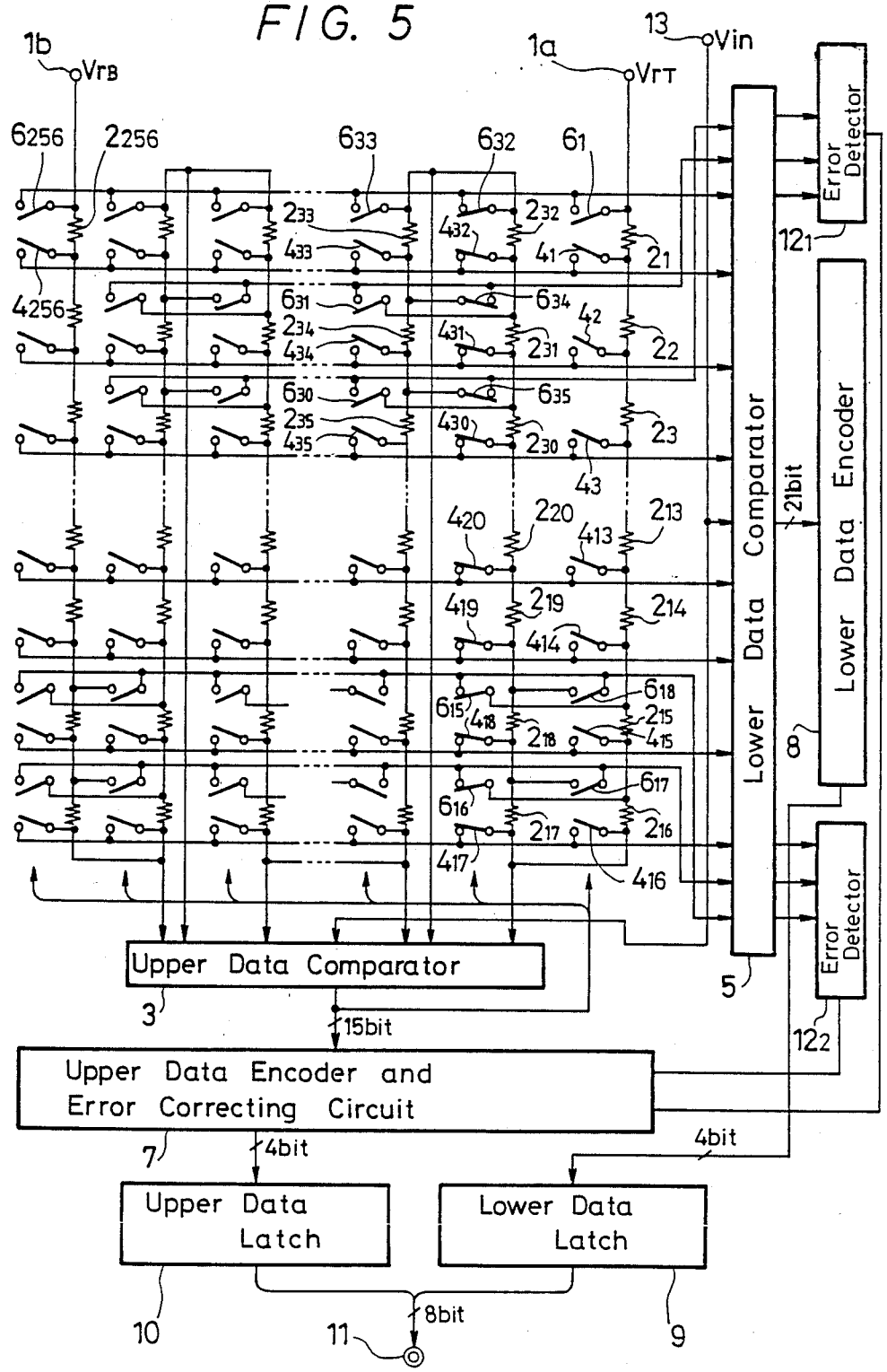
FIG. 5 is a block diagram illustrating a second embodiment of an A/D converter according to the present invention.

In FIG. 5, terminals $1a$ and $1b$ are respectively supplied with a maximal voltage $V_{rT}$ and a minimal voltage $V_{rB}$ used for A/D conversion. Between the terminals $1a$ and $1b$, a series circuit of 256 resistors $2_1$–$2_{256}$, for example, for eight-bit A/D conversion, having the same resistance value is provided in such a manner that resistor strings respectively formed of sixteen resistors are disposed in a zig-zag pattern, in the same manner as the construction shown in FIG. 1.

For simplification, parts in FIG. 5 in common with those in FIG. 1 are designated with the same reference numerals and the detailed explanation thereof will be omitted. Though the construction of FIG. 5 shows only one circuit for forming lower data, it is without saying that two sets of the same circuit may be provided in the same manner as the construction of FIG. 1 such that they are alternately operated to double the operating speed.

The resistors $2_1$–$2_{256}$ belonging to the same stages in the lateral direction have their one ends connected with each other through switches $4_1$–$4_{256}$, and fifteen of the respective connecting points are connected in parallel to a lower data comparator 5. In addition, eighty of the resistors belonging to the upper three stages and the lower two stages have their other ends connected with the resistors belonging to the same stage through eighty of corresponding switches $6_1$–$6_{256}$. Also, sixteen of the resistors in the lowermost stage have their one ends connected with each other through sixteen of newly provided switches $4_{16}$–$4_{240}$. The six connecting points are coupled to the lower data comparator 5.

These switches $6_1$–$6_{256}$ are arranged so as to be aligned on the same line with the switches $4_1$–$4_{256}$ which are respectively connected to one ends of the respective resistors adjacent to each other at turning points of the zig-zag line. For example, the switch $6_{34}$ connected to the other end of the resistor $2_{34}$ is disposed on the same vertical line as the switch $4_{31}$ connected to the other end of the resistor $2_{31}$ adjacent to the resistor $2_{34}$. In the same manner, the switch $6_{31}$ is disposed on the same vertical line as the switch $6_{34}$. The same arrangement is applied to the resistors belonging to the lower three stages. For example, the switch $6_{18}$ connected to the other end of the resistor $2_{18}$ is arranged on the same vertical line as the switch $4_{15}$ connected to the one end of the resistor $2_{18}$. The switches $6_1$, $6_{16}$ and so on connected to the resistors in the uppermost and lowermost stages may be arranged as shown in FIG. 5 since the same result is derived regardless of whether these switches are disposed in the above-mentioned reverse arrangement or not.

Since, as to the resistors $2_1$–$2_3$ and $2_{254}$–$2_{256}$ in the vicinity of the terminals $1a$ and $1b$, there are no resistors at the opposite side of the turning points, switches $6_2$, $6_3$ and $6_{254}$, $6_{255}$ are not provided for the corresponding resistors, and the switches $6_1$ and $6_{256}$ only are effective.

An input terminal 13 to which the signal voltage Vin is applied is connected to the comparators 3 and 5.

With the above-mentioned construction, the input signal voltage Vin is first compared with the voltages at the connecting points of every sixteen resistors of the resistors $2_1$–$2_{256}$ by the comparator 3, and fifteen outputs representing respective comparison results are derived. The outputs from the comparator 3 are formed such that one output corresponding to the input signal voltage Vin is at the high level and the remaining outputs are all at the low level.

The comparison outputs are supplied to an upper data encoding and error correcting circuit 7 for forming, for example, four-bit digital codes and effecting error correction which will be described later. One of the columns formed of the switches $4_1$–$4_{256}$ and $6_1$–$6_{256}$ in the vertical direction is selected in accordance with the comparison outputs, and the switches belonging to the selected column are all turned on. Incidentally, FIG. 5 shows that the high level is derived at the digit corresponding to the second column from the maximal voltage $V_{rT}$, and accordingly the switches $4_{17}$–$4_{32}$ and $6_{15}$, $6_{16}$, $6_{32}$, $6_{34}$ and $6_{35}$ belonging to the second column from the right of the drawing are all turned on.

Therefore, the comparator 5 is supplied with a total of twenty-one voltages between the other end of the resistor $2_{15}$ and the other end of the resistor $2_{35}$ which are respectively compared with the input signal voltage Vin to derive twenty-one of outputs representing comparison results.

These comparison outputs are supplied to a lower data encoder 8 for forming, for example, four-bit digital codes. Also, the comparison outputs corresponding to voltages from the switches $6_{32}$, $6_{34}$ and $6_{35}$ are supplied to an error detecting circuit (OR circuit) $12_1$, while the comparison outputs corresponding to voltages from the switches $6_{15}$, $6_{16}$ and $6_{17}$ are supplied to an error detecting circuit (OR circuit) $12_2$.

Figure 6:
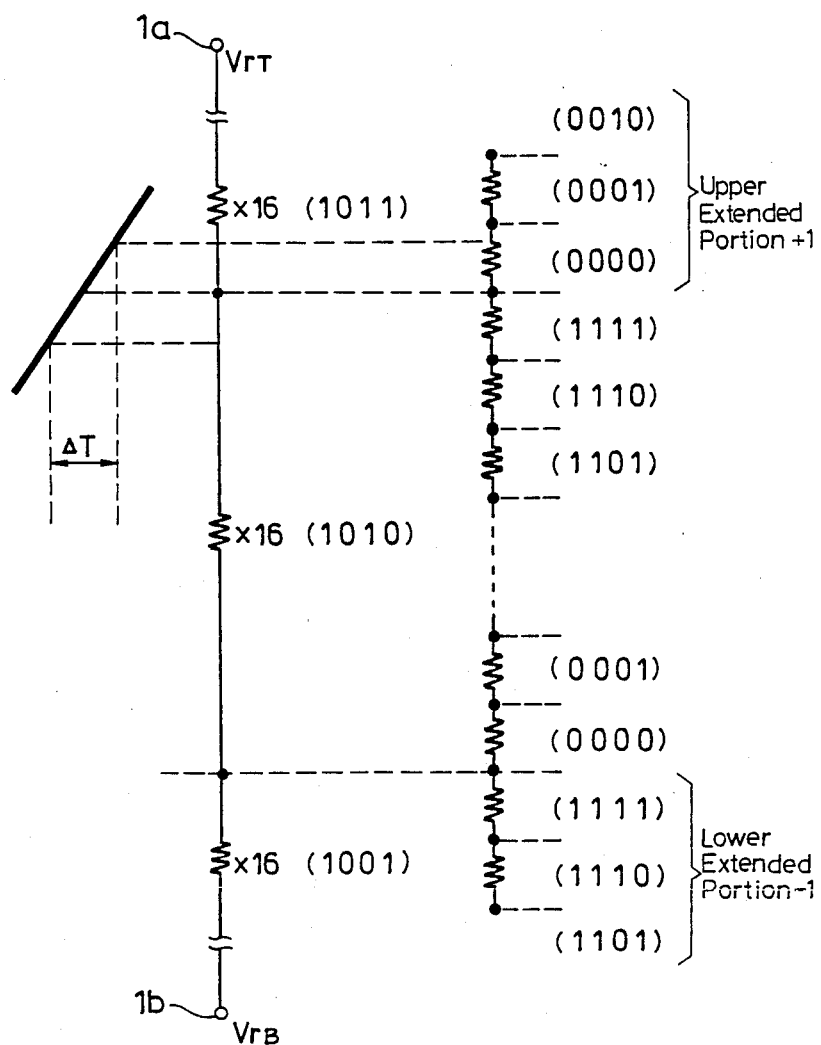
FIG. 6 is a diagram used for explaining the principle of the second embodiment of the present invention.

The lower data encoder 8, receiving twenty-one of the comparison results from the lower data comparator 5 and outputting four-bit lower data signal, is adapted to output (0000) when the voltage across, for example, the resistor $2_{17}$ corresponds to the input signal voltage Vin and also when the voltage across the resistor $2_{33}$ corresponds to the input signal voltage Vin as shown in FIG. 6. In the same manner, the encoder 8 outputs lower data (0001) when the resistor $2_{18}$ or $2_{34}$ corresponds to the input signal voltage Vin, (0010) when the resistor $2_{19}$ or $2_{35}$, (1111) when the resistor $2_{16}$ or $2_{32}$, (1110) when the resistor $2_{15}$ or $2_{31}$, and (1101) when the resistor $2_{11}$ or $2_{30}$ respectively correspond to the input signal voltage.

The signals from the error detecting circuits $12_1$ and $12_2$ are supplied to the upper data encoding and error correcting circuit 7. The circuit 7 adds "1" to or subtracts "1" from the encoded value of the upper data when a signal from the error detecting circuit $12_1$ is supplied thereto and subtracts "1" from or adds "1" to the encoded value of the upper data when a signal from the error detecting circuit $12_2$ is supplied thereto.

Subtraction or addition of "1" effected on the encoded value of the upper data by the outputs from the error detecting circuits $12_1$ and $12_2$ depends on the position of the selected column of the resistors. For example, assuming that the resistors $2_{17}$–$2_{32}$ in the second column from the right are selected as shown in FIG. 5, the output from the error detecting circuit $12_1$ causes the circuit 7 to subtract "1" from the encoded upper data, and on the other hand, the output from the error detecting circuit $12_2$ causes the circuit 7 to add "1" to the encoded upper data. If the resistors $2_{33}$–$2_{48}$ in the third column from the right are selected, the output from the error detecting circuit $12_1$ causes the circuit 7 to add "1" to the encoded upper data, and on the other hand, the output from the error detecting circuit $12_2$ causes the circuit 7 to subtract "1" from the encoded upper data.

The encoded value thus corrected by the correcting circuit 7 is latched by the upper data latch circuit 10 while the encoded value from the encoder 8 is latched by the lower data latch circuit 9. These latched values are combined and delivered to the output terminal 11.

Since the circuit of the second embodiment can extend the converting range of the lower data in the upward and downward directions as described above, A/D conversion can be favorably performed thereby.

Specifically explaining, when a conversion range of arbitrary lower data is determined by upper data, the comparator 5 is supplied with a voltage which provides an extension to the upper and lower portions of the determined conversion range, as shown in FIG. 6. The encoder 8 provides encoded values to the upper and lower extended portions of the conversion range as indicated in the right side of the drawing. If an output from the comparator 5 shows a value in the upper extended portion, "1" is added to the upper data, whereas if an output from the comparator 5 is a value in the lower extended portion, "1" is subtracted from the upper data, whereby the signal voltage Vin at the boundary portion of the upper data as shown in the left side of FIG. 6, for example, can be A/D converted with a favorable linearity.

FIGS. 7A-7I show timing charts of the operation of the circuit of the second embodiment. FIG. 7A shows an input signal Vin, and FIG. 7B a clock signal. In the comparator 3, a signal voltage $V_1$ is sampled ($S_1$) in the high level period of a cycle 1 of the clock signal and compared in the low level period of the same, as shown in FIG. 7C. By this operation, upper data $MD_1$ is formed in the high level period of a cycle 2 of the clock signal, as shown in FIG. 7D.

Next, switches are selected in accordance with the output from the comparator 3, whereby a voltage $RV_1$ as shown in FIG. 7F is supplied to the comparator 5.

In the comparator 5, as shown in FIG. 7G, the signal voltage $V_1$ sampled ($S_1$) in the high level period of the cycle 1 of the clock signal is held ($H_1$) in the low level period of the cycle 1 and the high level period of the cycle 2 of the clock signal and compared ($C_1$) in the low level period of the cycle 2 of the clock signal. Thus, lower data $LD_1$ is formed in the high level period of a cycle 3 of the clock signal as shown in FIG. 7H and the upper data is corrected to be corrected data $MD'_1$ as shown in FIG. 7E. Then, the corrected data and the lower data are outputted ($Out_1$) as shown in FIG. 7I.

At this time, the next signal voltage $V_2$ is sampled ($S_2$) as shown in FIGS. 7C and 7G, and thereafter the same operation is repeated.

As is apparent from FIG. 7, the A/D conversion is performed at a cycle of two clocks.

Incidentally, the signal voltage to be converted is the value held upon converting the lower data. It is therefore necessary to adjust bias or the like such that the held value has the necessary signal voltage.

The sample and hold circuit employed in the circuit of the second embodiment may be of relatively low quality if the fluctuation ratio is fixed. Further, the sample and hold circuit may be removed if the signal voltage changes at a low speed.

Also, the circuit of the second embodiment improves the disposition of switches to thereby facilitate the control thereof.

The above description is given for preferred embodiments of the invention but it will be apparent that many modifications and variations could be effected by one skilled in the art without departing from the spirits or scope of the novel concepts of the invention so that the scope of the invention should be determined by the appended claims only.

I claim as my invention:

1. An analog-to-digital converter for converting an analog input voltage signal to a digital output voltage signal of m upper bits and n lower bits, comprising:
   a plurality of resistor means connected in a series circuit to a voltage source for establishing respective reference voltages;
   upper bit encoder means having a first input receiving said analog input voltage and second inputs connected to said series circuit at respective intervals defining groups of said resistor means therebetween for generating said m upper bits and a switch control signal, each of said groups including a plurality of said resistor means;
   first lower bit encoder means having a first input receiving said analog input voltage signal and second inputs for generating said n lower bits;
   second lower bit encoder means having a first input receiving said analog input voltage signal and second inputs for generating said n lower bits;
   switch means associated with each of said groups of said resistor means and responsive to said switch control signal for selectively connecting each of said second inputs of said first and second lower bit encoder means to respective resistor means in said associated group of said resistor means, and
   means for alternately combining said m upper bits with said n lower bits generated by said first and second lower bit encoder means, and for generating said digital output voltage signal.

2. An analog-to-digital converter according to claim 1, wherein said resistor means are arranged in a plurality of rows, each of said groups constituting one of said rows.

3. An analog-to-digital converter according to claim 1, wherein said upper bit encoder means comprises at least $2^m-1$ upper bit comparators and said first and second lower bit encoder means respectively comprise at least $2^n-1$ lower bit comparators.

4. An analog-to-digital converter according to claim 1, wherein said resistor means are arranged in a zigzag pattern, said upper bit encoder means generates an inverting control signal and said converter further comprises means for inverting said n lower bits in response to said inverting control signal.

5. An analog-to-digital converter for converting an analog input voltage signal to a digital output voltage signal of m upper bits and n lower bits, comprising:
   a plurality of resistor means connected in a series circuit to a voltage source for establishing respective reference voltages;
   upper bit encoder means having a first input receiving said analog input voltage and second inputs connected to said series circuit at respective intervals defining groups of said resistor means therebetween for generating said m upper bits and a switch control signal, each of said groups including a plurality of said resistor means;
   lower bit encoder means having a first input receiving said analog input voltage signal, second inputs and third inputs for generating said n lower bits;
   switch means associated with each of said groups of said resistor means and responsive to said switch control signal for selectively connecting each of said second inputs of said lower bit encoder means to respective resistor means in said associated group of said resistor means and for selectively connecting each of said third inputs of said lower bit encoder means to a predetermined number of said resistor means adjoining to and outside said associated group of said resistor means; and means responsive to an output signal from said lower bit encoder means for adding 1 to or subtracting 1 from said m upper bits when said analog input voltage signal corresponds to said reference voltages supplied to said third inputs of said lower bit encoder means.

6. An analog-to-digital converter according to claim 5, wherein said resistor means are arranged in a plurality of rows, each of said groups constituting one of said rows.

7. An analog-to-digital converter according to claim 5, wherein said upper bit encoder means comprises at least $2^m-1$ upper bit comparators and said lower bit encoder means respectively comprises at least $2^n-1$ lower bit comparators.

8. An analog-to-digital converter according to claim 5, wherein said resistor means are arranged in a zigzag pattern, said upper bit encoder means generates an inverting control signal, and said converter further comprises means for inverting said n lower bits in response to said inverting control signal.

* * * * *